(12) United States Patent
Uchida et al.

(10) Patent No.: US 7,550,814 B2
(45) Date of Patent: Jun. 23, 2009

(54) SOLID-STATE IMAGING DEVICE

(75) Inventors: Mikiya Uchida, Kyoto (JP); Ken Mimuro, Toyama (JP); Mototaka Ochi, Toyama (JP)

(73) Assignee: Panasonic Corporation, Osaka (JP)

( * ) Notice: Subject to any disclaimer, the term of this patent is extended or adjusted under 35 U.S.C. 154(b) by 93 days.

(21) Appl. No.: 11/718,308

(22) PCT Filed: Oct. 28, 2005

(86) PCT No.: PCT/JP2005/019913

§ 371 (c)(1),
(2), (4) Date: Apr. 30, 2007

(87) PCT Pub. No.: WO2006/049102

PCT Pub. Date: May 11, 2006

(65) Prior Publication Data

US 2007/0290286 A1    Dec. 20, 2007

(30) Foreign Application Priority Data

Nov. 2, 2004   (JP)   ............................. 2004-319614

(51) Int. Cl.
    *H01L 31/00*  (2006.01)
(52) U.S. Cl. ................ 257/443; 257/431; 257/E31.001
(58) Field of Classification Search ................. 257/443, 257/431, E31.001
    See application file for complete search history.

(56) References Cited

U.S. PATENT DOCUMENTS 6,025,620 A    2/2000   Kimura et al.

(Continued)

FOREIGN PATENT DOCUMENTS

EP    1 075 028    2/2001

(Continued)

OTHER PUBLICATIONS

International Search Report from the corresponding PCT/JP2005/019913, mailed Jan. 10, 2006.

(Continued)

*Primary Examiner*—Long Pham
(74) *Attorney, Agent, or Firm*—Hamre, Schumann, Mueller & Larson, P.C.

(57)    ABSTRACT

A solid-state imaging device including: a plurality of photosensitive cells, each having a photodiode, arranged on a semiconductor substrate (1) in a matrix; and a peripheral driving circuit that has a plurality of transistors for driving the plurality of photosensitive cells. The plurality of transistors includes a first transistor and a second transistor, the first transistor having a first diffusion layer (2) as a source or a drain where a signal potential corresponding to a signal charge generated by the photodiode is transmitted and held, and the second transistor having a second diffusion layer as a source and a drain where the signal potential is not transmitted. An edge interval (D1) between an edge of a metal silicide layer (4) formed on a surface of the first diffusion layer and an edge of a gate electrode (6) in the first transistor is larger than an edge interval between an edge of a metal silicide layer formed on a surface of the second diffusion layer and an edge of a gate electrode in the second transistor. It is possible to suppress a leakage current in the transistors in the peripheral driving circuit, and to hold picked-up image information with high accuracy.

17 Claims, 11 Drawing Sheets

U.S. PATENT DOCUMENTS 7,342,269 B1  3/2008  Yuzurihara

FOREIGN PATENT DOCUMENTS

| JP | 5-326522 | 12/1993 |
| --- | --- | --- |
| JP | 10-027907 | 1/1998 |
| JP | 11-097649 | 4/1999 |
| JP | 2001-111022 A | 4/2001 |
| JP | 2001-274259 | 10/2001 |
| JP | 2002-134743 | 5/2002 |
| JP | 2002-198523 | 7/2002 |

OTHER PUBLICATIONS

Kazuya Yonemoto, "Basics and Applications of CCD/CMOS Image Sensor", CQ Publishing Co., Ltd., p. 175-176. (Partial English translation included), Aug. 2003.

SOLID-STATE IMAGING DEVICE

TECHNICAL FIELD

The present invention relates to a solid-state imaging device that has a plurality of photosensitive cells arranged in a matrix and outputs pixel signals from the photosensitive cells as image signals, and particularly to a structure of a transistor that is a component of a solid-state imaging device.

BACKGROUND ART

A typical conventional solid-state imaging device will be described with reference to FIG. 10. This solid-state imaging device includes a plurality of photosensitive cells 30 arranged in a matrix and a peripheral driving circuit for driving the photosensitive cells 30. Each of the photosensitive cells 30 includes a photodiode 31 for converting incident light into an electric charge, a transfer transistor 32, an amplifier transistor 33, and a reset transistor 34. On the other hand, the peripheral driving circuit includes a vertical driver circuit 36 for extracting electric charges of the plurality of photosensitive cells 30 to a vertical signal line 35 as pixel signals, a noise suppressing circuit 37 for suppressing noise in the pixel signals extracted from the plurality of photosensitive cells 30, a horizontal transistor group 38 for controlling the output of the pixel signals from the noise suppressing circuit 37, a horizontal driver circuit 39 for driving the horizontal transistor group 38, and a load transistor group 40 (see Non-patent Document 1, for example).

A gate electrode of the transfer transistor 32 is connected to the vertical driver circuit 36 via a transfer control signal line 41. The transfer transistor 32 transfers a signal charge generated by the photodiode 31 to a gate electrode of an amplifier transistor 33 in accordance with a transfer control signal from the vertical driver circuit 36. Structurally, a source region of the transfer transistor 32 is formed of a part of the photodiode 31.

A source of the amplifier transistor 33 is connected to a source of a load transistor 40a and the noise suppressing circuit 37 via the vertical signal line 35. A drain of the amplifier transistor 33 is connected to a drain line 42. The amplifier transistor 33 sends a pixel signal to the vertical signal line 35 in accordance with a potential based on the signal charge input to the gate electrode from the transfer transistor 32. Due to the use of the amplifier transistor 33 as a source follower, the pixel signal sent to the vertical signal line 35 is amplified with a different amplification factor depending on the potential of the gate electrode of the amplifier transistor 33.

A gate electrode of the reset transistor 34 is connected to the vertical driver circuit 36 via a reset signal line 43. A source of the reset transistor 34 is connected to a drain of the transfer transistor 32 and the gate electrode of the amplifier transistor 33. A drain region of the reset transistor 34 is connected to the drain line 42. The reset transistor 34 resets a potential of the drain of the transfer transistor 32, i.e., the potential of the gate electrode of the amplifier transistor 33, to a predetermined initial value in accordance with a reset signal from the vertical driver circuit 36.

A drain of the load transistor 40a is connected to a load (constant current source) via wiring 44. A gate electrode of the load transistor 40a is connected to a control signal line 45 for controlling the connection between the vertical signal line 35 and the load.

The output of the noise suppressing circuit 37 is transmitted to a horizontal signal line 46 via a horizontal transistor 38a constituting the horizontal transistor group 38.

In this solid-state imaging device, when the characteristics such as a threshold voltage of the amplifier transistors 33 included in the respective plurality of photosensitive cells 30 vary, fixed pattern noise appears in the pixel signals on the vertical signal line 35. The noise suppressing circuit 37 is provided to suppress the fixed pattern noise.

FIG. 11 shows one of the photosensitive cells 30 and a specific configuration of an equivalent circuit of the noise suppressing circuit 37 connected to the photosensitive cell 30. The noise suppressing circuit 37 includes a transistor 50, a large-capacitance capacitor 51 formed on a semiconductor substrate as an element having an MIM (Metal Insulator Metal) structure, a DMOS (Double-diffused MOS) structure or the like, a clamping transistor 52, and a capacitor 53 formed as an element like the capacitor 51. FIG. 11 shows the case where the load transistor 40a is in an ON state and the drain of the amplifier transistor 33 is grounded via a constant current source (load) 54.

An operation of the solid-state imaging device having the above-mentioned configuration will be described with reference to FIG. 11.

(Operation A) Initially, a potential at a node 55, i.e., the potential of the drain region (floating diffusion) of the transfer transistor 32 and the gate electrode of the amplifier transistor 33, is reset to a predetermined potential VDD. At this time, a potential V1 of the vertical signal line 35 (node 56) is expressed as follows.

$$V1 = VDD - VGS \tag{1}$$

In Formula 1, VGS represents a constant value determined depending on an operating point.

(Operation B) Then, the clamping transistor 52 is turned ON, and a potential at a node 57 is set to VDD. Holding the potential of the node 57 to be a potential of VDD, the transistor 50 is turned ON. This allows the capacitor 51 to be charged. A final electric charge Q to be accumulated in the capacitor 51 is expressed as follows.

$$Q = C1(VDD - V1) \tag{2}$$

In Formula 2, C1 represents a capacitance of the capacitor 51.

(Operation C) Then, the clamping transistor 52 is turned OFF. Here, the transistor 50 remains in an ON state.

(Operation D) Then, the transfer transistor 32 is turned ON, and an electric charge Q1 generated by the photodiode 31 is transferred to the drain region of the transfer transistor 32. As a result, the potential at the node 55 becomes a potential VG corresponding to the electric charge Q1. The potential VG is expressed as follows in accordance with a parasitic capacitance (capacitance accompanying the floating diffusion) C of the transfer transistor 32: VG=VDD−Q1/C. Accordingly, a potential V2 of the vertical signal line 35 is expressed as follows.

$$V2 = VG - VGS = VDD - Q1/C - VGS \tag{3}$$

The electric charge Q accumulated in the capacitor 51 is distributed to the capacitor 51 and the capacitor 53 in accordance with their capacitances. Defining that the potential at the node 57 is Vout, Vout is equal to the solutions of the following simultaneous equations.

$$C1(Vout - V2) = Q + \Delta Q \tag{4}$$

$$C2 \times Vout = -\Delta Q \tag{5}$$

In Formula 5, C2 represents a capacitance of the capacitor 53. As a result of solving the above simultaneous equations, Vout is expressed as follows.

$$Vout = C1/(C1+C2) \times (VDD - Q1/C) \quad (6)$$

This state is maintained until the potential at the node 57 is stabilized at Vout.

(Operation E) Then, in the state where the potential at the node 57 is Vout, the horizontal transistor 38a is turned ON based on a horizontal control signal from the horizontal driver circuit 39. As a result, the potential Vout is transmitted to the horizontal signal line 46, and a voltage corresponding to Vout is output via an amplifier 58. In other words, a voltage that varies depending on the electric charge Q1 generated by the photodiode 31 is output as an image signal.

In general, the characteristics such as a threshold voltage of all the amplifier transistors 33 formed for the respective photosensitive cells 30 are not always uniform. Accordingly, fixed pattern noise appears in the pixel signal of the potential V2 on the vertical signal line 35. However, with the noise suppressing circuit 37, the pixel signal of the potential Vout that has passed through the noise suppressing circuit 37 does not include a member (VGS) dependent on variations in the characteristics of the amplifier transistor 33, and thus is free from an influence of fixed pattern noise.

As described above, it is required that the signal potential be held at the node 57 from the moment the potential at the node 55 is reset to VDD until the pixel signal is output to the horizontal signal line 46 via the horizontal transistor 38a (during the period between Operation B and Operation D). Unless the signal potential at the node 57 is held, a malfunction occurs in the noise suppressing circuits 37. More specifically, the image signals corresponding to all the photosensitive cells 30 connected to the single vertical signal line 35 have voltages different from the voltage of the signal in accordance with the electric charge Q1 generated by the photosensitive cells 30. In the case of an image display based on such image signals, display defects occur in an entire single vertical row of pixels, and the defective displays in a vertical line are observed in the image.

As described above, in the solid-state imaging device in which each of the photosensitive cells 30 has the amplifier transistor 33 and the peripheral driving circuit has the noise suppressing circuit 37, it is particularly important to suppress a leakage of current in the clamping transistor 52 in the noise suppressing circuit 37 that has to hold the transmitted signal potential for a predetermined period of time.

In general, a leakage of current in a transistor generally is divided into a pn-junction opposite-direction leakage and an off leakage. In recent years, as transistors become smaller, a GIDL (gate induced drain leakage), which is a kind of off leakage, has become a particular problem.

Hereinafter, the GIDL will be described. FIG. 12 is a schematic cross-sectional view partially showing a structure of a MOS transistor for explaining the GIDL. FIG. 12 shows a part of an n-channel transistor from a gate electrode to a drain region. A drain region 61 is formed on a surface region of a semiconductor substrate 60, and a gate electrode 63 is formed on a top surface via a gate oxide film 62. On an end face of the gate oxide film 62 and the gate electrode 63, a sidewall spacer 64 is provided.

As shown in FIG. 12, there is an overlapping region 65 between the gate electrode 63 and the drain region 61. In the overlapping region 65, when an electric field that allows a positive hole to be accumulated on a semiconductor substrate 60 side is applied between the gate electrode 63 and the drain region 61 via the gate oxide film 62, a conduction type on a surface of the drain region 61 is converted into a p-type by the action of the electric field, and a valence band level is developed in the overlapping region 65. As a result, a band-to-band tunnel current is generated between the valence band level developed in the overlapping region 65 and a conduction band level on a drain region 61 side, and this current becomes a substrate current (indicated by an arrow 66 in FIG. 12). The current leakage thus occurring is referred to as a GIDL.

Further, in recent years, as transistors in a solid-state imaging device become smaller, it is becoming popular to form a refractory metal silicide layer on a surface of diffusion layers constituting a source region and a drain region, respectively, of a MOS transistor by using a salicide process, so as to reduce the resistance of the respective diffusion layers of the source region and the drain region. In such a case, the GIDL is reported to be remarkable (see Non-patent Document 2, for example).

Non-patent Document 1: Basics and Applications of CCD/CMOS Image Sensor, CQ Publishing Co., Ltd., Pages 175-176

Non-patent Document 2: Woo-Tag Kang et al.: IEEE, Electron Device Lett. 21, 9, 2000

DISCLOSURE OF INVENTION

Problem to be Solved by the Invention

A peripheral driving circuit in a conventional solid-state imaging device is formed usually by a manufacturing process flow for used for microfabrication of a usual CMOS logic device. Therefore, current leakage characteristics of transistors included in the peripheral driving circuit remain within the allowable range for the CMOS logic device.

On the other hand, as described above, in some of the transistors constituting the peripheral driving circuit in the conventional solid-state imaging device, it is required for a source region and/or a drain region to receive a transmitted signal potential corresponding to a signal charge generated by a photodiode and to hold the transmitted signal potential for a predetermined period of time.

A requirement for current leakage characteristics in such transistor is not as severe as that for current leakage characteristics in a photodiode, since the transistor holds the signal potential for a time period shorter than a time period during which the signal charge is accumulated in the photodiode. However, when the transistor is formed in the same manner as that for a transistor such as a CMOS logic device, a leakage current increases, and it is impossible to generate an image signal that holds picked-up image information sufficiently. Based on such an image signal, a seriously defective image is displayed.

Further, when a refractory metal silicide layer is formed on a part of the surface of the diffusion layer constituting the source region and/or the drain region, a leakage current increases further. This makes it more difficult to generate an image signal that holds picked-up image information sufficiently.

It is an object of the present invention to provide a solid-state imaging device that suppresses a current leakage such as a GIDL in transistors included in a peripheral driving circuit, holds a pixel signal with high accuracy, and converts the same into an image signal, whereby image quality can be improved.

Means for Solving Problem

A solid-state imaging device according to the present invention includes: a plurality of photosensitive cells, each having a photodiode, arranged on a semiconductor substrate in a matrix; and a peripheral driving circuit that has a plurality of transistors formed on the semiconductor substrate and is configured to drive the plurality of photosensitive cells. The plurality of transistors includes a first transistor and a second transistor, the first transistor having a first diffusion layer as a source or a drain where a signal potential corresponding to a signal charge generated by the photodiode is transmitted and held, and the second transistor having a second diffusion layer as a source and a drain where the signal potential is not transmitted.

In order to solve the above-mentioned problems, a first edge interval as a distance between an edge of a metal silicide layer formed on a surface of the first diffusion layer and an edge of a gate electrode in the first transistor is larger than a second edge interval as a distance between an edge of a metal silicide layer formed on a surface of the second diffusion layer and an edge of a gate electrode in the second transistor.

The "distance" or the "interval" between two elements as used herein refers to the shortest distance between two images of the respective elements projected on a surface of a semiconductor substrate in a direction normal thereto.

EFFECTS OF THE INVENTION

According to the solid-state imaging device of the present invention, the first edge interval in the first transistor is larger than the second edge interval in the second transistor, whereby a current leakage such as a GIDL in the first diffusion layer that holds the signal potential corresponding to the signal charge generated by the photodiode can be made lower than that in the second diffusion layer where the signal potential is not transmitted. Therefore, it is possible to generate an image signal that holds picked-up image information with high accuracy, whereby an image displayed based on the generated image signal is improved in quality.

Figure 1:
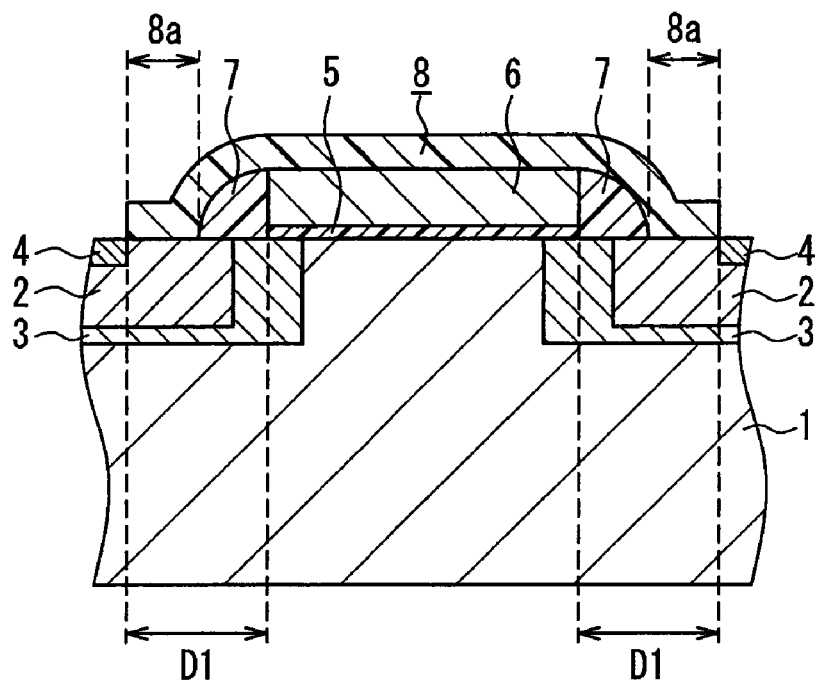
FIG. 1 is a cross-sectional view schematically showing a first transistor included in a solid-state imaging device according to Embodiment 1.

EXPLANATION OF LETTERS OR NUMERALS 1, 60 Semiconductor substrate
2 $n^+$ diffusion layer
3 LDD region
4, 4a, 4b, 11, 12, 14, 20 Metal silicide layer
5, 62 Gate insulating film
6, 9, 15, 17, 63 Gate electrode
7, 7a, 7b, 18, 23, 64 Sidewall spacer
8, 16 Silicide blocking film
8a, 16a Covering portion
10, 13, 19 Polysilicon film
21 First layer spacer
22 Second layer spacer
30 Photosensitive cell
31 Photodiode
32 Transfer transistor
33 Amplifier transistor
34 Reset transistor
35 Vertical signal line
36 Vertical driver circuit
37 Noise suppressing circuit
38 Horizontal transistor group
38a Horizontal transistor
39 Horizontal driver circuit
40 Load transistor group
40a Load transistor
41 Transfer control signal line
42 Drain line
43 Reset signal line
44 Wiring
45 Control signal line
46 Horizontal signal line
50 Transistor
51, 53 Capacitor
52 Clamping transistor
54 Constant current source (load)
55, 56, 57 Node
58 Amplifier
61 Drain region 65 Overlapping region
66 Arrow

DESCRIPTION OF THE INVENTION

In a solid-state imaging device of the present invention, a plurality of photosensitive cells may have any well-known configuration. Further, a peripheral driving circuit may have any well-known configuration. Further, a second transistor may have any well-known configuration.

The solid-state imaging device according to the present invention may have only a function of converting picked-up image information into an image signal. Alternatively, in addition to the function of converting picked-up image information into an image signal, the solid-state imaging device may also have a function of displaying an image based on the converted image signal.

The effect of the present invention can be achieved when at least one first transistor is included in the peripheral driving circuit. A plurality of transistors further may include a transistor having a configuration different from configurations of the first transistor and the second transistor. When the plurality of transistors include a plurality of first transistors, the plurality of first transistors may have the same configuration or different configurations. Similarly, when the plurality of transistors include a plurality of second transistors, the plurality of second transistors may have the same configuration or different configurations. A transistor included in a photosensitive cell may have the same configuration as that of the first transistor.

On a diffusion layer (hereinafter, referred to as a paired diffusion layer) that is opposed to a first diffusion layer of the first transistor with a gate electrode interposed therebetween, and forms a source or a drain, no metal silicide layer may be formed, or a metal silicide layer may be formed partially. When a metal silicide layer is formed on the paired diffusion layer, an edge interval between the metal silicide layer on the diffusion layer and a gate electrode is substantially not more than a first edge interval.

On a diffusion layer of the second transistor, no metal silicide layer may be formed, or a metal silicide layer may be formed partially. When a metal silicide layer is formed on the diffusion layer of the second transistor, an edge interval between the metal silicide layer on the diffusion layer and a gate electrode is smaller than the first edge interval.

In the solid-state imaging device of the present invention, an edge interval between a metal silicide layer formed on a surface of a diffusion layer that pairs up with the first diffusion layer to constitute the source or the drain and the gate electrode in the first transistor is substantially the same as the first edge interval.

With this configuration, it is possible to suppress a leakage current such as a GIDL in the diffusion layer that pairs up with the first diffusion layer of the first transistor. In other words, a current leakage such as a GIDL in both the source region and the drain region in the first transistor can be suppressed as compared with that in the second transistor.

In the present specification, two intervals being substantially the same refers to the two intervals not being made different from each other intentionally. Therefore, two intervals being substantially the same also refers to the case where the two intervals are slightly different from each other due to a manufacturing tolerance or the like.

Further, an edge interval between a metal silicide layer formed on a surface of a diffusion layer that pairs up with the first diffusion layer to constitute the source or the drain and the gate electrode in the first transistor may be smaller than the first edge interval.

Further, an edge interval between a metal silicide layer formed on a surface of a diffusion layer that pairs up with the first diffusion layer to constitute the source or the drain and the gate electrode in the first transistor may be substantially the same as the second edge interval in the second transistor.

In the solid-state imaging device of the present invention, it is preferable that the peripheral driving circuit has a vertical driver circuit connected to the plurality of photosensitive cells for sequentially extracting a plurality of pixel signals in accordance with the signal charge in units of horizontal rows, a noise suppressing circuit for removing noise from the plurality of pixel signals extracted by the vertical driver circuit, and a horizontal driver circuit for sequentially outputting the plurality of pixel signals from the noise suppressing circuit in temporal order, and the first transistor is included in the noise suppressing circuit.

As described in the prior art above, when a leakage current in a transistor included in the noise suppressing circuit is large, a signal different from a regular signal in accordance with a signal charge generated by a photosensitive cell is output from the noise suppressing circuit, so that defects in a vertical linear form are observed in an image forming device inside or outside the solid-state imaging device. With the above-described configuration, however, a regular signal (signal that holds picked-up information with high accuracy) in accordance with a signal charge can be output sufficiently, whereby it is possible to suppress the occurrence of defects in a vertical linear form in an image.

It is preferable that the first edge interval is 60 nm or more.

Further, it is preferable that the first transistor has an insulating film provided so as to range from the gate electrode to a part of the first diffusion layer, and the insulating film forms a first covering portion covering an end of the first diffusion layer, and a distance from an edge of the gate electrode on a first diffusion layer side to an edge of the first covering portion on a side farther from the gate electrode is substantially the same as the first edge interval.

In this case, the position of the end of the metal silicide layer on the first diffusion layer on a gate electrode side is controlled by the first covering portion of the insulating film. In other words, the first edge interval can be controlled simply by patterning for forming the insulating film.

In the present specification, the distance from the end of the gate electrode on the first diffusion layer side to the edge of the first covering portion on the side farther from the gate electrode in the first transistor being substantially the same as the first edge interval also refers to the case where the distance is not precisely the same as the interval between the gate electrode and the metal silicide layer on the first diffusion layer due to a heat treatment for forming the metal silicide layer. The same applies to the metal silicide layers on the other diffusion layers.

In the above configuration, it is preferable that an edge interval between a metal silicide layer formed on a surface of a diffusion layer that pairs up with the first diffusion layer to constitute the source or the drain and the gate electrode in the first transistor is substantially not more than the first edge interval, the insulating film is provided so as to range from the gate electrode to a part of the paired diffusion layer, and forms a second covering portion covering a part of its surface, and a distance from an edge of the gate electrode on a paired diffusion layer side to an edge of the second covering portion on a side farther from the gate electrode is substantially the same as an edge interval between the gate electrode and the metal silicide layer on the paired diffusion layer.

Further, in the solid-state imaging device of the present invention, it is possible that the first transistor has a first sidewall spacer formed on an end surface of the gate electrode on a first diffusion layer side, and an insulating film provided so as to range from the gate electrode through the first sidewall spacer to a part of the first diffusion layer, the insulating film forms a first covering portion covering an end of the first diffusion layer, and a distance from an edge of the gate electrode on the first diffusion layer side to an edge of the first covering portion on a side farther from the gate electrode is substantially the same as the first edge interval, and the second transistor has a second sidewall spacer formed on an end surface of the gate electrode on a second diffusion layer side, and the second sidewall spacer has a width substantially the same as the second edge interval.

In this case, even with the configuration in which the first transistor and the second transistor has the sidewall spacers, the position of the edge of the metal silicide layer on the first diffusion layer on a gate electrode side is controlled by the first covering portion of the insulating film. In other words, the first edge interval can be controlled simply by patterning for forming the insulating film. Further, the position of the edge of the metal silicide layer on the second diffusion layer in the second transistor is controlled by the sidewall spacer in the second transistor.

In the above configuration, it is possible that an edge interval between a metal silicide layer formed on a surface of a diffusion layer that pairs up with the first diffusion layer to constitute the source or the drain and the gate electrode in the first transistor is substantially not more than the first edge interval, the first sidewall spacer also is formed on an end surface of the gate electrode on a paired diffusion layer side in the first transistor, and the insulating film is provided so as to range from the gate electrode through the first sidewall spacer to a part of the paired diffusion layer, and forms a second covering portion covering a part of its surface, and a distance from an edge of the gate electrode on the paired diffusion layer side to an edge of the second covering portion on a side farther from the gate electrode is substantially the same as an edge interval between the gate electrode and the metal silicide layer on the paired diffusion layer.

Further, it is possible that an edge interval between a metal silicide layer formed on a surface of a diffusion layer that pairs up with the first diffusion layer to constitute the source or the drain and the gate electrode in the first transistor is substantially smaller than the first edge interval, and the first sidewall spacer also is formed on an end surface of the gate electrode on a paired diffusion layer side in the first transistor, and the first sidewall spacer has a width substantially the same as an edge interval between the gate electrode and the metal silicide layer on the paired diffusion layer.

Further, it is possible that the insulating film is a silicide blocking film.

Further, in the solid-state imaging device of the present invention, it is possible that the first transistor has a first sidewall spacer formed on an end surface of the gate electrode on a first diffusion layer side, and the first sidewall spacer has a width substantially the same as the first edge interval, and the second transistor has a second sidewall spacer formed on an end surface of the gate electrode on a second diffusion layer side, and the second sidewall spacer has a width substantially the same as the second edge interval.

In this case, the position of the edge of the metal silicide layer on the first diffusion layer on a gate electrode side in the first transistor is controlled by the first sidewall spacer. Further, the position of the edge of the metal silicide layer on the second diffusion layer on a gate electrode side in the second transistor is controlled by the second sidewall spacer. Therefore, the first edge interval and the second edge interval can be controlled simply by controlling the widths of the first and the second sidewall spacers, respectively.

In the above configuration, it is possible that an edge interval between a metal silicide layer formed on a surface of a diffusion layer that pairs up with the first diffusion layer to constitute the source or the drain and the gate electrode in the first transistor is substantially not more than the first edge interval, and the first sidewall spacer also is formed on an end surface of the gate electrode on a paired diffusion layer side in the first transistor, and the first sidewall spacer has a width substantially the same as an edge interval between the gate electrode and the metal silicide layer on the paired diffusion layer.

Further, it is possible that the sidewall spacer in the first transistor is made of a material different from that of the sidewall spacer in the second transistor.

Further, it is possible that the sidewall spacer in the first transistor is formed of a silicon nitride film, and the sidewall spacer in the second transistor is formed of a silicon oxide film.

Figure 10:
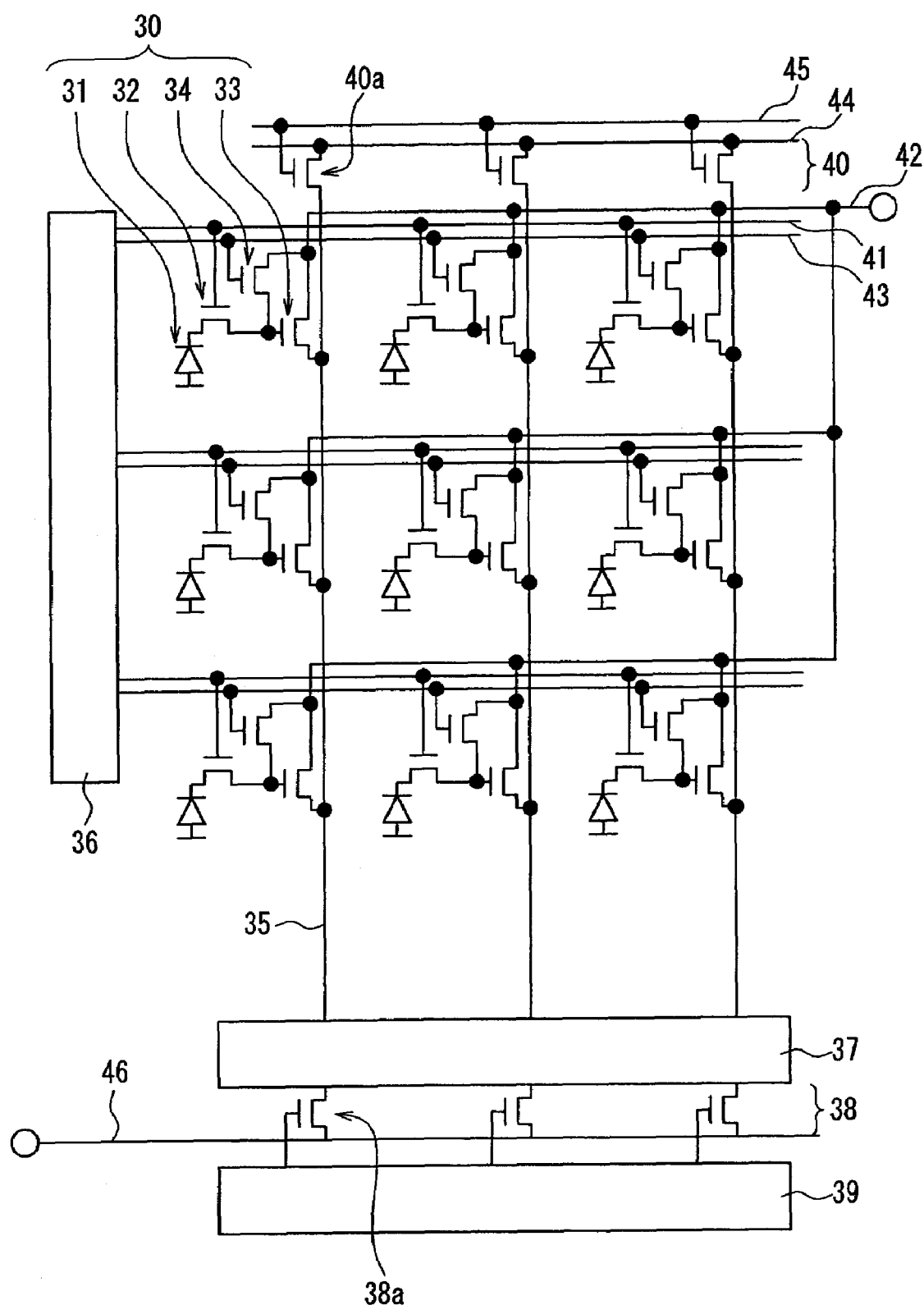
FIG. 10 is a diagram schematically showing a configuration of a typical solid-state imaging device according to a conventional example.
Figure 11:
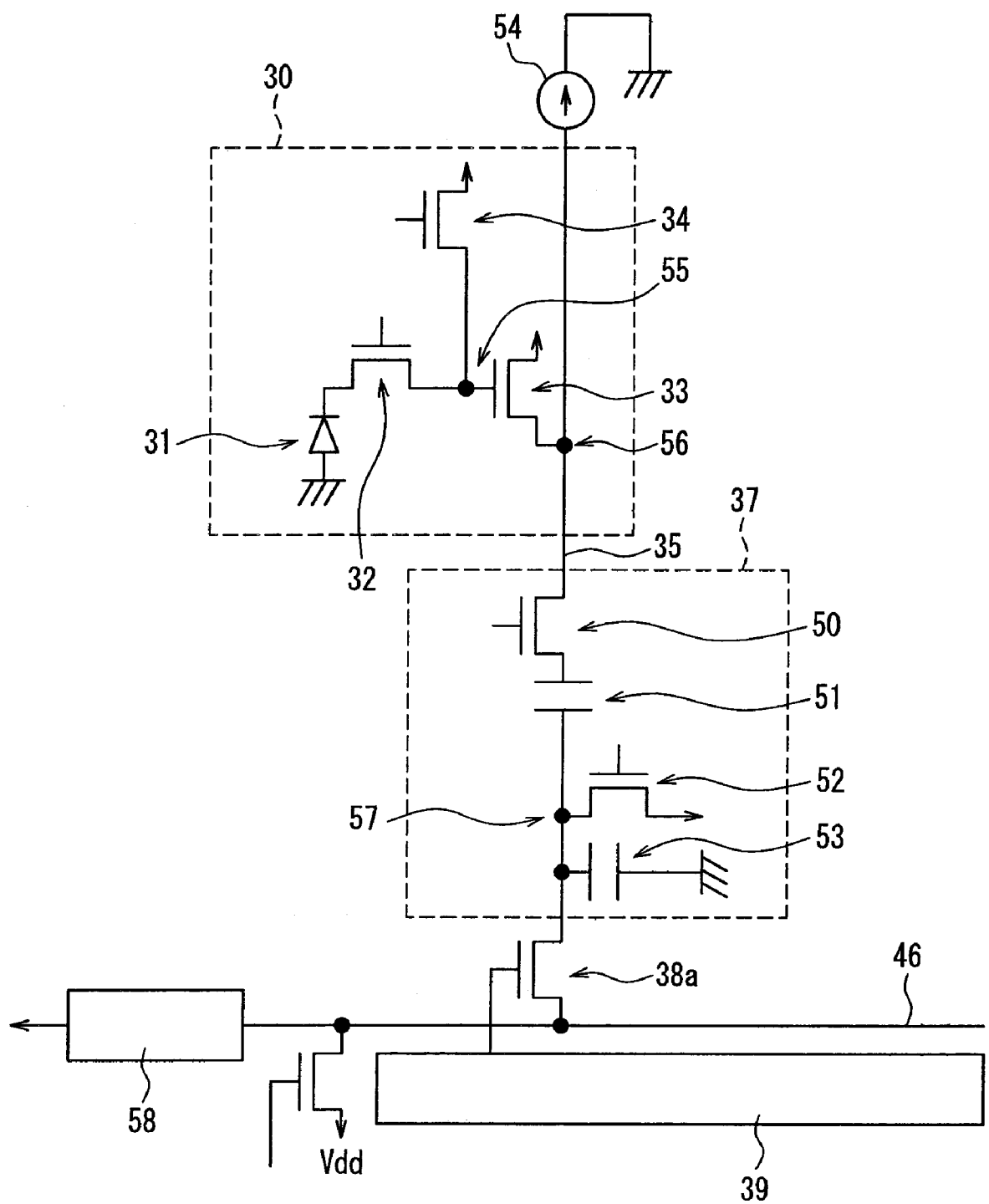
FIG. 11 is an equivalent circuit diagram for explaining an operation of the solid-state imaging device.
Figure 12:
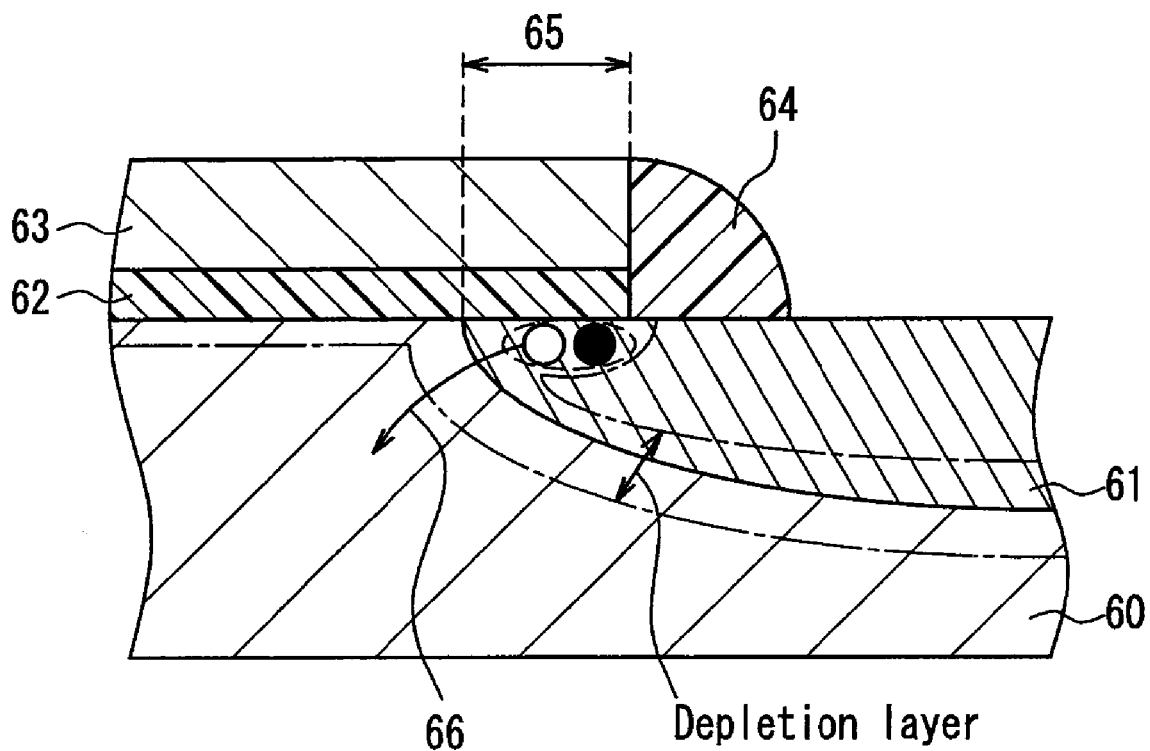
FIG. 12 is a cross-sectional view schematically showing a part of a transistor for explaining a GIDL in a solid-state imaging device according to a conventional example.

Hereinafter, a solid-state imaging device according to an embodiment of the present invention will be described in more detail with reference to the drawings. An overall configuration of the solid-state imaging device in each embodiment may be one as shown in FIGS. 10 and 11, for example. The present invention is characterized in a configuration of the clamping transistor 52, i.e., a transistor for use in a region where a signal potential corresponding to a signal charge generated by a photodiode is transmitted and held for a predetermined period of time, included in the noise suppressing circuit 37 in the solid-state imaging device as shown in FIGS. 10 and 11. As such a transistor, a low leakage transistor is formed, which will be referred to as a first transistor in the following description. A transistor that need not have the above-mentioned function will be referred to as a second transistor. In each embodiment, descriptions will be given only of configurations of the first and the second transistors.

EMBODIMENT 1

Figure 2:
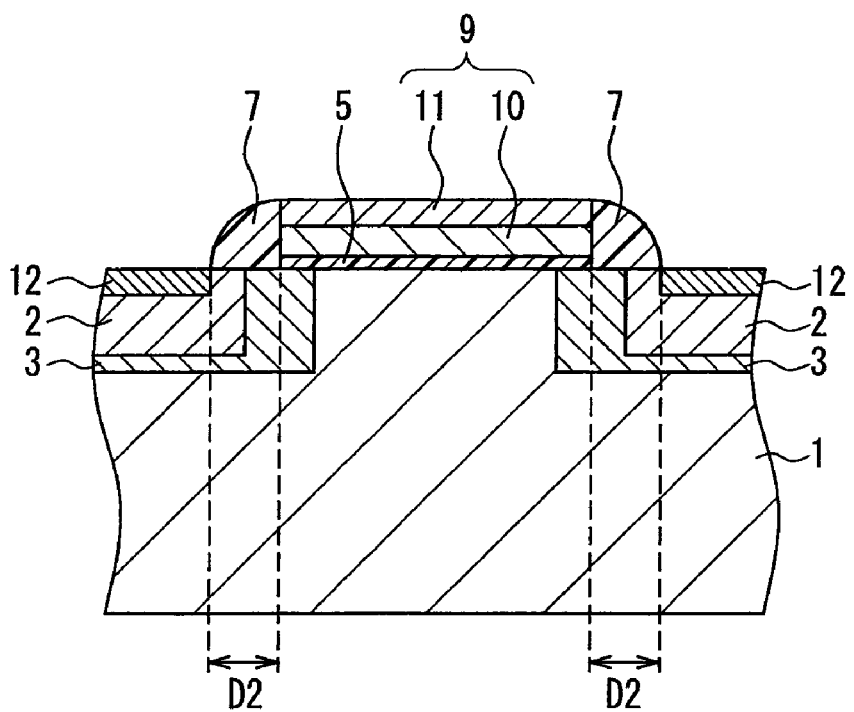
FIG. 2 is a cross-sectional view schematically showing a second transistor included in the solid-state imaging device.

FIG. 1 is a cross-sectional view of a first transistor constituting a solid-state imaging device according to Embodiment 1. FIG. 2 is a cross-sectional view of a second transistor.

The first transistor shown in FIG. 1 has a pair of $n^+$ diffusion layers 2 constituting a source or a drain and a pair of LDD regions 3 of $n^-$ diffusion layers that are formed on a p-type semiconductor substrate 1. The $n^+$ diffusion layer 2 may be formed in a p-type well instead of on the p-type semiconductor substrate 1. On the semiconductor substrate 1, a gate electrode 6 formed of a polysilicon film is provided via a gate insulating film 5. Sidewall spacers 7 are formed on both end surfaces of the gate electrode 6. Both the sidewall spacers 7 have substantially the same width.

An insulating silicide blocking film 8 is formed so as to cover the gate electrode 6, the sidewall spacers 7, and end regions of the $n^+$ diffusion layers 2. A portion of the silicide blocking film 8 that covers a part of the $n^+$ diffusion layer 2 beyond an edge of the sidewall spacer 7 is referred to as a covering portion 8a in the following description. The covering portions 8a on respective $n^+$ diffusion layer 2 sides have substantially the same width. A metal silicide layer 4 is formed on a surface portion of the $n^+$ diffusion layer 2 that is not covered with the covering portion 8a.

One of the n+ diffusion layers 2 in the first transistor is connected to the node 57 shown in FIG. 11 at which a signal transmitted to the noise suppressing circuit is held as a potential.

It is sufficient that the sidewall spacer 7 is formed so as to cover at least the end surface of the gate electrode 6 adjacent to the n+ diffusion layer 2. However, the sidewall spacer 7 may be formed over the whole of or a part of other end surfaces of the gate electrode 6.

On the other hand, the second transistor shown in FIG. 2 has a pair of n+ diffusion layers 2 and a pair of LDD regions 3 formed on the same p-type semiconductor substrate 1 as that for the first transistor. Thus, the n+ diffusion layer 2 may be formed in a p-type well instead of on the p-type semiconductor substrate 1 in some cases. On the semiconductor substrate 1, a gate electrode 9 is formed via a gate insulating film 5. The gate electrode 9 is formed of a polysilicon film 10 and a metal silicide layer 11. Sidewall spacers 7 are formed on both end surfaces of the gate electrode 9. A metal silicide layer 12 is formed on a surface portion of the n+ diffusion layer 2 that is beyond an edge of the sidewall spacer 7.

In the second transistor, the silicide blocking film 8 as provided in the first transistor is not formed. The second transistor has the same configuration as that of a conventional general transistor, and is formed by the same manufacturing process as that for a transistor for a usual CMOS logistic device.

The sidewall spacer 7 in the second transistor and the sidewall spacer 7 in the first transistor are the same, and have the same width. Accordingly, the positional relationship between the edge of the sidewall spacer 7 and an edge of the n+ diffusion layer 2 is the same between the first transistor and the second transistor. Therefore, an interval (hereinafter, referred to as an edge interval) D1 between the edge of the gate electrode 6 and an edge of the metal silicide layer 4 in the first transistor shown in FIG. 1 is larger than an edge interval D2 between the gate electrode 9 and the metal silicide layer 12 in the second transistor shown in FIG. 2 by the width of the covering portion 8a of the silicide blocking film 8.

In a channel region between the pair of LDD regions 3, channel doping may be performed to adjust a threshold voltage of the first or the second transistor. An n-type impurity in each of the n+ diffusion layers 2 may be of the same or a different type, and may be diffused with the same or a different profile. The same applies to an n-type impurity in the LDD region 3. The n-type impurity in the n+ diffusion layer 2 and the n-type impurity in the LDD region 3 may be of the same type or different types.

Next, a description will be given of an exemplary method for forming the first transistor shown in FIG. 1 and the second transistor shown in FIG. 2 on the same semiconductor substrate 1 together.

Initially, the gate insulating film 5 and a polysilicon film for the gate electrodes 6 and 9 for forming the first and the second transistors are formed collectively on the p-type semiconductor substrate 1. After the formation of the polysilicon film, the LDD regions 3 are formed. After the LDD regions 3 are formed, the sidewall spacers 7 are formed, followed by the formation of the n+ diffusion layers 2. The process so far can be performed using any technique for forming a well-known transistor.

After the formation of the n+ diffusion layers 2, an insulating film is formed on an entire surface of the semiconductor substrate 1. The insulating film is patterned by using a photolithography technique and an etching technique, so that the insulating silicide blocking film 8 for covering the gate electrode 6 of the first transistor is formed. The insulating film is made of a material that does not combine with the semiconductor substrate 1 or a material that does not form conductive metal silicide even when it combines with the semiconductor substrate 1.

After the silicide blocking film 8 is formed, a metal film of titanium, cobalt, or the like, which combines with silicon to form metal silicide, is deposited on an entire surface of the semiconductor substrate 1. Then, the substrate is subjected to a heat treatment, so that an interface between the semiconductor substrate 1 and the metal film is made silicide, thereby forming the metal silicide layers 4 and 12. At the same time, an interface between the polysilicon film constituting the gate electrode 9 of the second transistor and the metal film becomes silicide, thereby forming the metal silicide layer 11 also on a surface layer portion of the polysilicon film 10. The surface of the semiconductor substrate 1 of the first transistor that is covered with the covering portion 8a of the silicide blocking film 8 does not become silicide.

After the formation of the metal silicide layers 4, 11, and 12, the remaining unreacted metal film is removed. By the above-mentioned process, the first transistor and the second transistor can be formed on the semiconductor substrate 1 together.

In the first transistor of the present embodiment shown in FIG. 1, the edge interval D1 between the gate electrode 6 and the metal silicide layer 4 is larger than the edge interval D2 between the gate electrode 9 and the metal silicide layer 12 of the second transistor shown in FIG. 2, whereby a current leakage such as a GIDL is reduced as compared with the second transistor.

Figure 3:
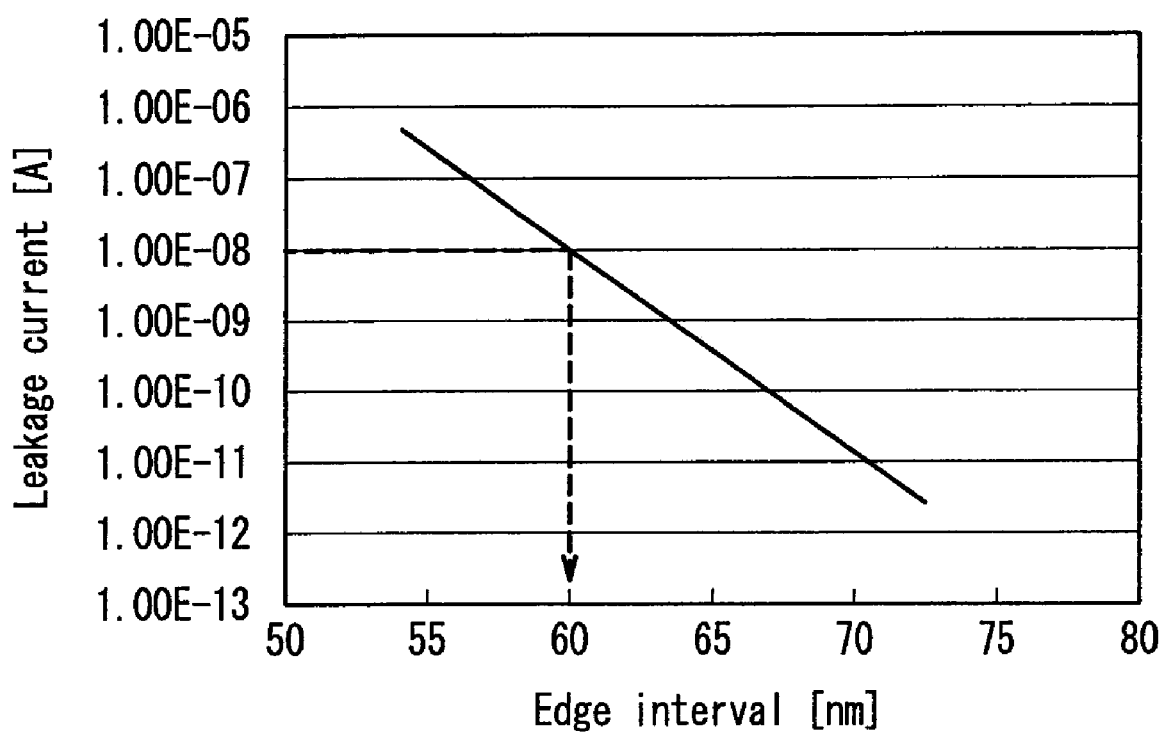
FIG. 3 is a graph showing the relationship between an edge interval between a gate electrode and a metal silicide layer of a transistor and a leakage current (substrate current).

In general, a current leakage in a transistor is suppressed when an interval between a gate electrode and a metal silicide layer is large. This will be described in the following. FIG. 3 is a graph showing the relationship between an edge interval (edge interval D1, D2 in FIGS. 1, 2) between a gate electrode and a metal silicide layer and a leakage current (substrate current) in a transistor. In FIG. 3, the leakage current on the vertical axis is expressed in a logarithmic scale, and the edge interval on the horizontal axis expressed in a linear scale. The leakage current in FIG. 3 indicates a leakage current with respect to a transistor width (a length in a direction perpendicular to a place of a paper of FIG. 1 etc.) of 10 μm. More specifically, it is a converted value obtained by calculating I×10/W[A] where W[μm] is the transistor width and I[A] is a measured value of the leakage current. In general, the leakage current is nearly proportional to the transistor width unless the transistor width is extremely small (e.g., less than 0.5 μm). Accordingly, the relationship between the edge interval and the leakage current qualitatively shows nearly the same tendency with respect to a different transistor width.

As shown in FIG. 3, the leakage current increases exponentially (linearly in FIG. 3) with the edge interval. Thus, it can be seen that an increase in the edge interval suppresses a current leakage.

In order to allow a solid-state imaging device to output an image signal in which a defective display of a vertical line is suppressed to an invisible extent, a leakage spec with respect to the n+ diffusion layer 2 (see FIG. 1) of the first transistor is preferably 10 nA or less with respect to a transistor width of 10 μm at a drain voltage VD of 8V. To this end, the edge interval should be 60 nm or more as can be seen from FIG. 3. In other words, the edge interval D1 between the gate electrode 6 and the metal silicide layer 4 in the first transistor is preferably 60 nm or more. Note here that an edge interval of more than 80 nm does not contribute to a decrease in the current leakage to a significant extent worth, compared with 80 nm. On this account, the edge interval is preferably 80 nm or less.

Figure 4A:
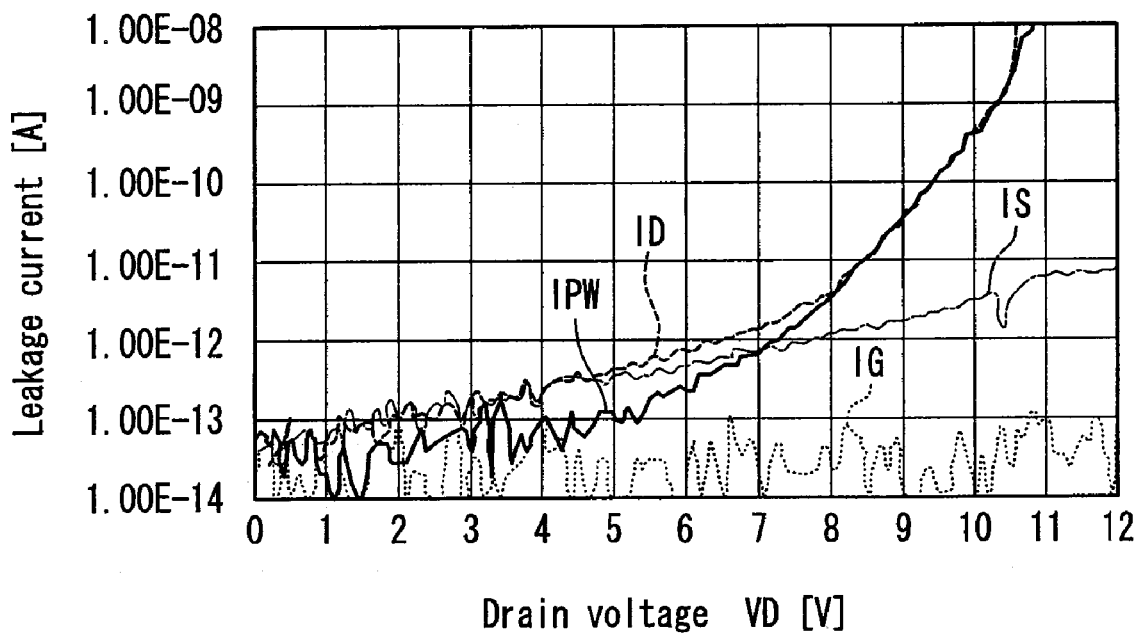
FIG. 4A is a graph showing the relationship between a drain voltage and a leakage current of a transistor.
Figure 4B:
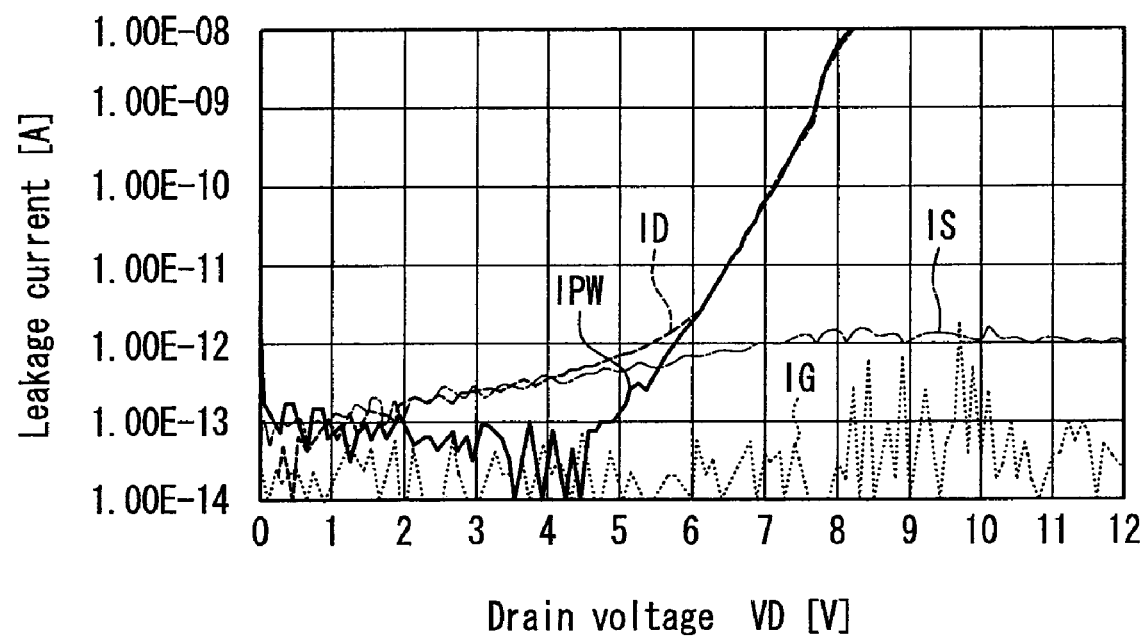
FIG. 4B is a graph showing the relationship between a drain voltage and a leakage current of a transistor having an edge interval different from that in FIG. 4A.

FIG. 4A is a graph showing the relationship between a drain voltage and the leakage current when the edge interval is 71.5 nm. FIG. 4B is a graph showing the relationship between the drain voltage and the leakage current when the edge interval is 60 nm. In FIGS. 4A and 4B, the vertical axis represents a value of the leakage current in a logarithmic scale, and the horizontal axis represents a drain voltage VD in a linear scale. A solid line indicates a substrate current (IPW) component (GIDL component), a broken line indicates a drain current (ID) component, an alternate long and short dash line indicates a source current (IS) component, and a dotted line indicates a gate current (IG) component of the leakage current. Each of the current components shown in FIGS. 4A and 4B is expressed as a measured value itself when the transistor width is substantially 4 µm, and not as a converted value with respect to a transistor width of 10 µm as shown in FIG. 3.

In comparison between FIGS. 4A and 4B, it can be seen that when the edge interval is larger, the substrate current (IPW) component and the drain current (ID) component increase with the drain voltage VD at a lower rate. Further, FIGS. 4A and 4B show that the gate current (IG) component and the source current (IS) component hardly depend on the edge interval, and that only the substrate current (IPW) component and the drain current (ID) component of the leakage current substantially depend on the edge interval.

FIG. 3 shows the relationship between the edge interval and the leakage current (substrate current) only with respect to a drain voltage VD of 8V. However, as can be seen from FIGS. 4A and 4B, at the same drain voltage VD, a larger edge interval generally leads to a lower substrate current (IPW) component and a lower drain current (ID) component of the leakage current.

Figure 5A:
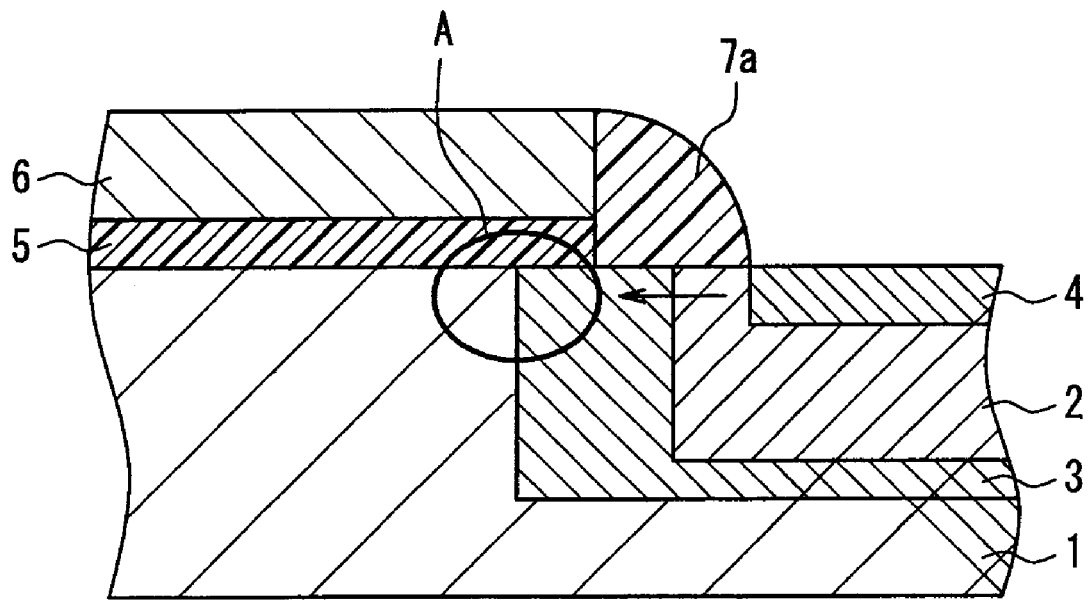
FIG. 5A is a schematic view for explaining the principle that the leakage current varies with the edge interval in Embodiment 1.
Figure 5B:
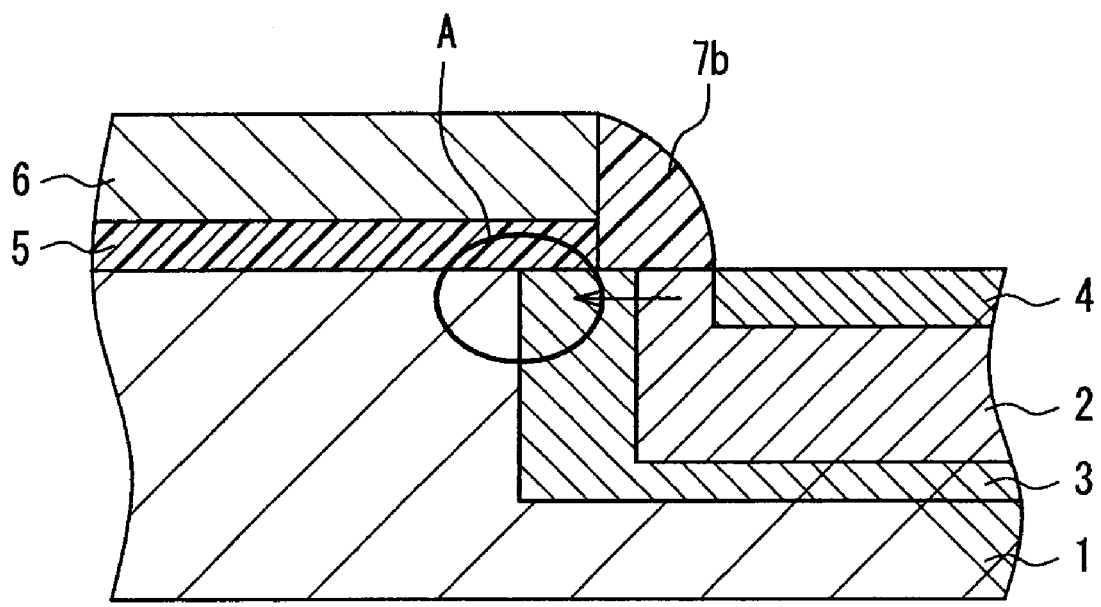
FIG. 5B is another schematic view for explaining the principle that the leakage current varies with the edge interval as in FIG. 5A.

FIGS. 5A and 5B are cross-sectional views of a part of a transistor for explaining the leakage current changing with the edge interval. The same components as those in the first transistor shown in FIG. 1 are described with the same reference numerals assigned thereto. Each of the transistors shown in FIGS. 5A and 5B has a configuration different from that of the first transistor in that the silicide blocking film 8 (see FIG. 1) is not provided. However, the leakage current (current leakage characteristics) does not depend on the presence/absence of the silicide blocking film 8, and thus the following description can be applied to the first transistor. FIG. 5A shows the case where a sidewall spacer 7a has a larger width and the edge interval is larger. FIG. 5B shows a case where a sidewall spacer 7b has a smaller width and the edge interval is smaller.

The metal silicide layer 4 is formed by a thermal reaction between the semiconductor substrate 1 and a metal film (not shown) in contact with the semiconductor substrate 1. In a heat treatment for accelerating the thermal reaction, a heat treatment to be performed after the formation of the metal silicide layer 4 and the like, a metal element as a simple substance included in the metal silicide layer 4 and/or a compound (metal silicide) of silicon in the semiconductor substrate 1 with the metal element is diffused toward a channel side as indicated by an arrow in FIGS. 5A and 5B. When the metal element and/or the metal silicide is diffused to a GIDL occurrence region A on the semiconductor substrate 1, a trap level that acts as a trap of a carrier is developed in a band gap due to defects and impurities (metal element and/or metal silicide) in the GIDL occurrence region A. It is considered that a band-to-band tunnel current (substrate current, GIDL current) flows between a conduction band and a valence band via the trap level.

FIGS. 6A to 6E show exemplary energy band structures in the vicinity of the GIDL occurrence region A where no trap level is developed, for conceptually explaining the mechanism of generating a band-to-band tunnel current. In each of the energy band structures shown in FIGS. 6A to 6E, a vertical line represents an interface between a drain region 2 (semiconductor substrate 1) and the gate insulating film 5, and the right side of the vertical line shows a depth direction of the drain region 2. The energy band structure is expressed on the basis of electron energy. In FIGS. 6A to 6E, an upper part shows higher energy, and a lower part shows lower energy. Since a GIDL becomes a problem when a transistor is in an OFF state, FIGS. 6A to 6E show the cases where a gate voltage (Vg) is 0 V.

Figure 6A:
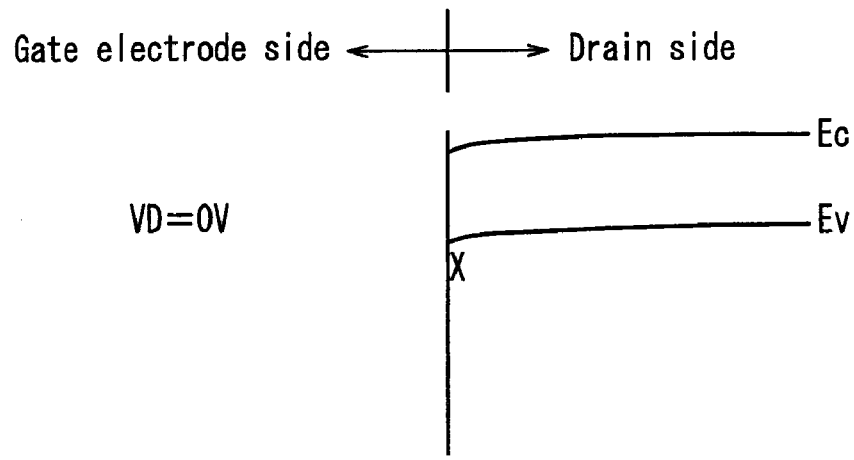
FIG. 6A is a schematic view for conceptually explaining the principle of generating a band-to-band tunnel current, showing an exemplary energy band structure in the vicinity of a GIDL occurrence region where no trap level is developed in Embodiment 1.

First, a description will be given of the relationship between the drain voltage and the energy band structure in the vicinity of the GIDL occurrence region A where no trap level is developed. FIG. 6A shows an energy band structure in the case where the drain voltage (VD) is 0 V. As shown in FIG. 6A, a maximum energy level (Ev) in a valence band and a minimum energy level (Ec) in a conduction band are bent to an extremely small extent.

Figure 6B:
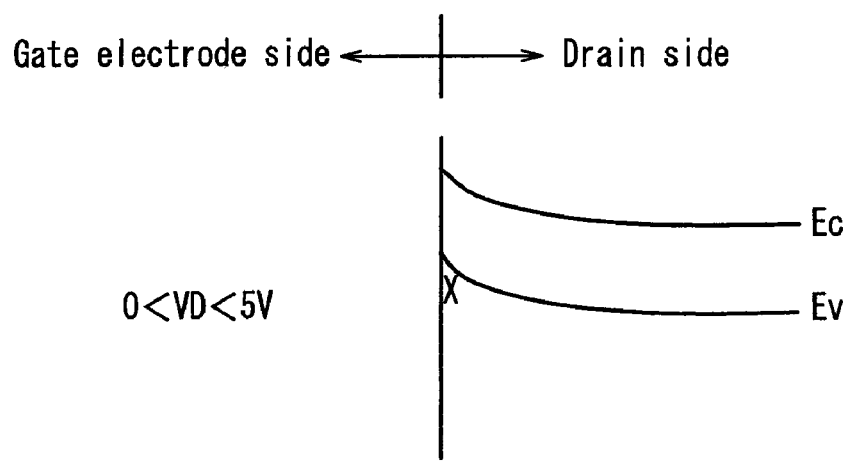
FIG. 6B is a schematic view showing another exemplary energy band structure in the vicinity of a GIDL occurrence region as in FIG. 6A.

FIG. 6B shows an energy band structure in the case where the drain voltage is higher than 0 V and lower than 5V. As shown in FIG. 6B, Ev and Ec are bent to a larger extent as the drain voltage increases. However, since Ec inside the drain region 2 is higher than Ev on a surface of the drain region 2, a positive hole with predetermined energy indicated by a mark X cannot move energetically to a conduction band.

Figure 6C:
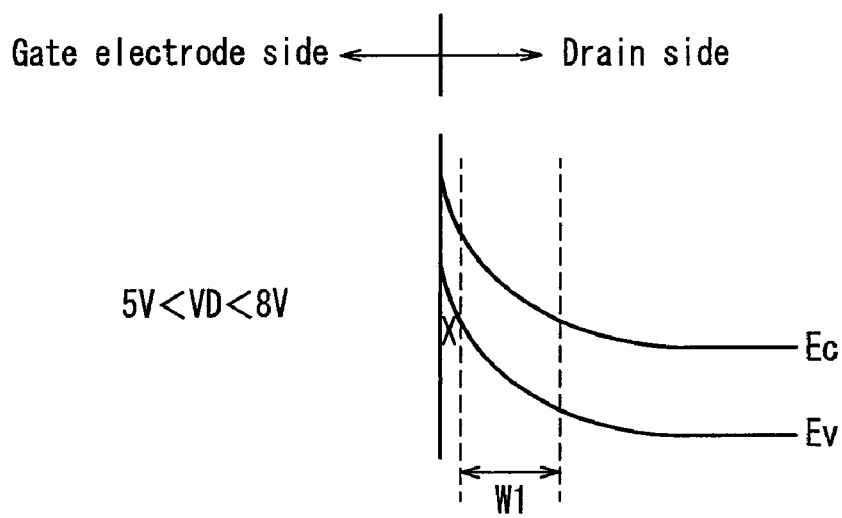
FIG. 6C is a schematic view showing another exemplary energy band structure in the vicinity of a GIDL occurrence region as in FIG. 6A.

FIG. 6C shows an energy band structure in the case where the drain voltage is higher than 5 V and lower than 8 V. As shown in FIG. 6C, Ev and Ec are bent to an extent larger than that in the case where the drain voltage is higher than 0 V and lower than 5V and Ev on the surface of the drain region 2 is higher than Ec inside the drain region 2. More specifically, a band gap (Ev–Ec) serves as an energy barrier against a positive hole (mark X in FIG. 6C) with predetermined energy. However, the positive hole X cannot move to a conduction band beyond the energy barrier due to a large barrier width W1, and thus a tunnel current from a valence band to the conduction band hardly is generated.

Figure 6D:
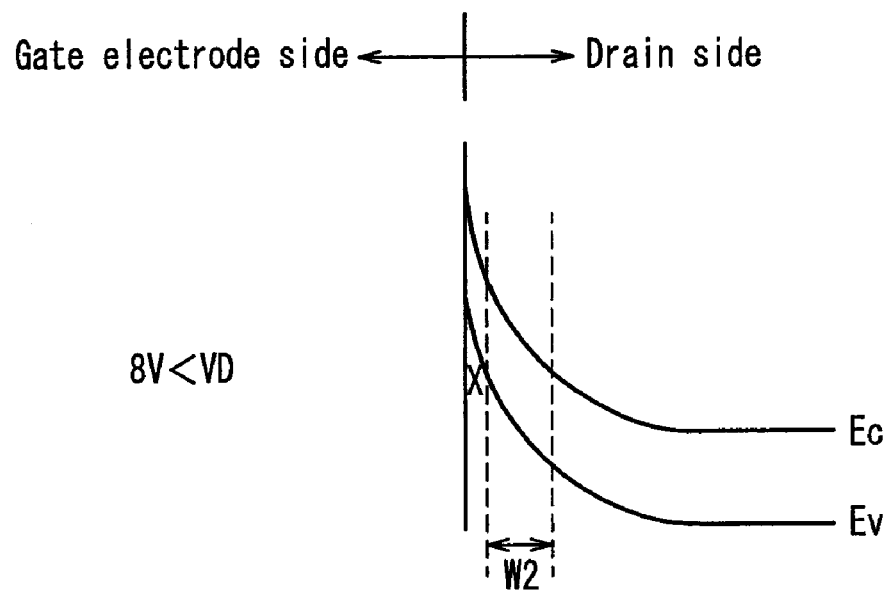
FIG. 6D is a schematic view showing another exemplary energy band structure in the vicinity of a GIDL occurrence region as in FIG. 6A.

FIG. 6D shows an energy band structure in the case where the drain voltage is higher than 8 V. As shown in FIG. 6D, Ev and Ec are bent to an extent much larger than that in the case where the drain voltage is higher than 5 V and lower than 8 V, and a barrier width W2 against a positive hole X with predetermined energy is smaller. In this case, the positive hole X with predetermined energy can pass directly through the energy barrier to a conduction band, and thus a tunnel current from a valence band to the conduction band is generated.

Figure 6E:
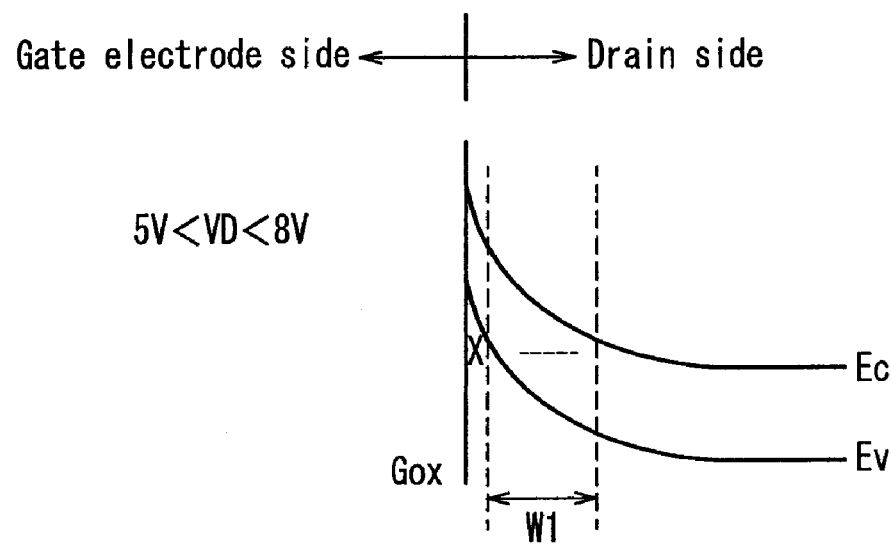
FIG. 6E is a schematic view showing another exemplary energy band structure in the vicinity of a GIDL occurrence region as in FIG. 6A.

FIG. 6E shows the relationship between the drain voltage and the energy band structure in the vicinity of the GIDL occurrence region A where a trap level is developed. FIG. 6E shows an energy band structure in the case where the drain voltage is higher than 5 V and lower than 8 V.

In the case where the drain voltage is lower than 5 V, a tunnel current from a valence band to a conduction band hardly is generated as in the above-mentioned case. However, in the case where the drain voltage is higher than 5 V and lower than 8 V, a positive hole X with predetermined energy can pass through an energy barrier to the conduction band via the trap level even when the barrier has the same width as the barrier width W1 shown in FIG. 6C. As a result, a tunnel current is generated from the valence band to the conduction band. Further, in the case where the drain voltage is higher than 8 V, the positive hole X can pass through the energy barrier directly and via the trap level, resulting in a tunnel current higher than that in the case shown in FIG. 6D. Note here that a higher density trap level leads to a larger amount of positive holes that can pass through the energy barrier, resulting in a higher tunnel current from the valence band to the conduction band.

When the edge interval is large as shown in FIG. 5A, the metal element and/or the metal silicide is not diffused to the GIDL occurrence region A, or is diffused less, whereby the density of the trap level in the GIDL occurrence region A can be decreased. Thus, by making the edge interval larger, a tunnel current in the diffusion layer can be reduced.

As described above, in the first transistor in Embodiment 1, the edge interval D1 is larger than the edge interval D2 in the second transistor, whereby a GIDL in the n$^+$ diffusion layer 2 can be suppressed. Therefore, the solid-state imaging device according to Embodiment 1 can generate an image signal that holds picked-up image information with high accuracy. Further, a defective display in an image display device inside or outside the solid-state imaging device can be suppressed.

In the above-described transistor, the covering portions 8a on both sides of the gate electrode 6 are included in the single continuous silicide blocking film 8. However, the transistor may have another configuration. For example, it is also possible to provide a first silicide blocking film including one of the covering portions 8a and a second silicide blocking film including the other covering portion 8a that is separate from the first silicide blocking film.

In the above description, each of the first transistor and the second transistor is a LDD-type transistor having the sidewall spacers and the LDD regions. However, the transistor may have a configuration without the sidewall spacers and the LDD regions. In such a case, an edge of a diffusion region on a gate electrode side is located at substantially the same position as that of the edge of the LDD region on a gate electrode 6 side shown in FIG. 1.

EMBODIMENT 2

Figure 7:
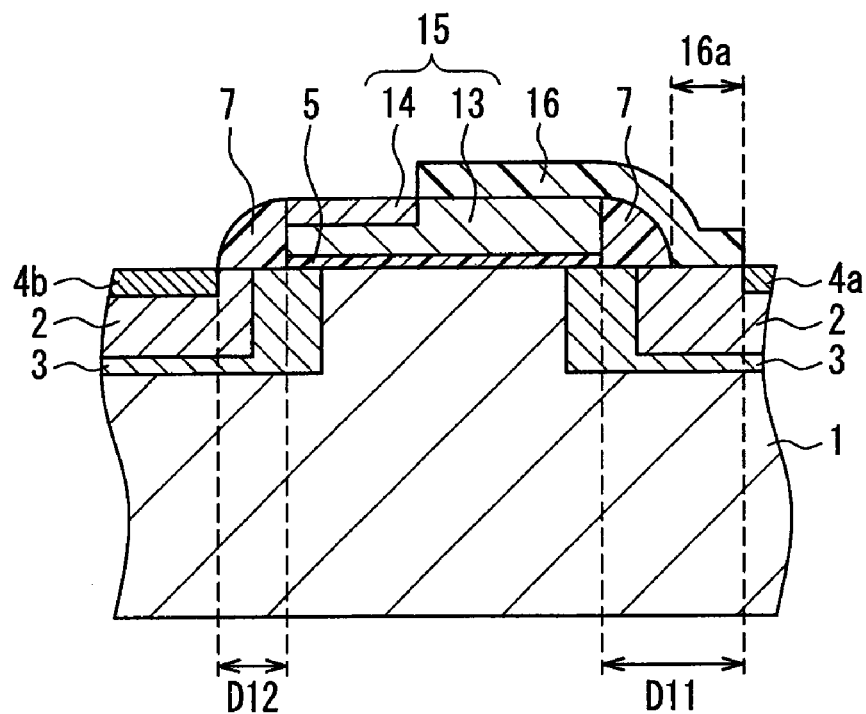
FIG. 7 is a cross-sectional view schematically showing a first transistor in Embodiment 2.

A solid-state imaging device according to Embodiment 2 will be described with reference to FIG. 7 showing a cross section of a first transistor. The solid-state imaging device in Embodiment 2 is the same as that according to Embodiment 1 except for a configuration of the first transistor. Thus, the same components as those in Embodiment 1 are denoted with the same reference numerals, and repeated descriptions thereof will be omitted. A second transistor is the same as that shown in FIG. 2.

The first transistor in the present embodiment is configured such that an edge interval D11 between a metal silicide layer 4a on an n$^+$ diffusion layer 2 on one side (right side) and a gate electrode 15 is larger than an edge interval D12 between a metal silicide layer 4b on an n$^+$ diffusion layer 2 on the other side (left side) and the gate electrode 15 due to a silicide blocking film 16. The n$^+$ diffusion layer 2 on which side the larger edge interval D11 is formed is connected to the node 57 at which a signal taken into the noise suppressing circuit in FIG. 11 is held as a potential.

The configuration of this first transistor is different from that of the first transistor in Embodiment 1 in the metal silicide layers 4a and 4b, the gate electrode 15, and the silicide blocking film 16.

The silicide blocking film 16 covers only a right side region of a polysilicon film 13 forming the gate electrode 15, and a left side is exposed. Thus, a metal silicide layer 14 is formed on a surface layer portion of the left side region of the polysilicon film 13 that is not covered with the silicide blocking film 16. Further, the silicide blocking film 16 is not formed on the n$^+$ diffusion layer 2 on the left side. The silicide blocking film 16 is provided so as to range from the right side region of the gate electrode 15 through a sidewall spacer 7 on a right side to an end region of the n$^+$ diffusion layer 2, forming a covering portion 16a covering the end region of the n$^+$ diffusion layer 2.

The metal silicide layer 4a on the n$^+$ diffusion layer 2 on the right side is formed on a surface portion that is not covered with the silicide blocking film 16. Accordingly, an edge of the metal silicide layer 4a is controlled by an edge of the covering portion 16a of the silicide blocking film 16. The metal silicide layer 4b on the n$^+$ diffusion layer 2 on the left side is formed in a region beyond an edge of the sidewall spacer 7. Accordingly, an edge of the metal silicide layer 4b is controlled by the sidewall spacer 7.

With the above-described configuration, the edge interval D11 between the metal silicide layer 4a and the gate electrode 15 is equal to the sum of the width of the sidewall spacer 7 and the width of the covering portion 16a. On the other hand, the edge interval D12 between the gate electrode 15 and the metal silicide layer 4b is substantially the same as the width of the sidewall spacer 7, i.e., the edge interval D2 in the second transistor in Embodiment 1 as shown in FIG. 2. As described above, the edge interval D11 is larger than the edge interval D12 by the width of the covering portion 16a.

The first transistor shown in FIG. 7 is formed by the method for forming the first transistor and the second transistor together in Embodiment 1, using a mask pattern different from that in Embodiment 1 in a process of patterning an insulating film for forming the silicide blocking film 16.

In the first transistor in the present embodiment, a current leakage such as a GIDL on the n$^+$ diffusion layer 2 is not suppressed on the left side where the covering portion 16a of the silicide blocking film 16 is not provided. However, as can be seen from FIG. 11, it is only one n$^+$ diffusion layer 2 that affects the transmission of a signal potential. Therefore, as in the solid-state imaging device of Embodiment 1, it is possible to transmit an image signal that holds picked-up information with high accuracy, and to suppress a defective display in an image display device or the like sufficiently.

In the above-described configuration, the silicide blocking film 16 includes the covering portion 16a only on one side. However, a covering portion may be provided on the other side of the silicide blocking film 16 to have a width smaller than that of the covering portion 16a.

In the above description, each of the first transistor and the second transistor is a LDD-type transistor having the sidewall spacers and the LDD regions 3. However, the first transistor and the second transistor may have a configuration without the LDD regions.

EMBODIMENT 3

Figure 8:
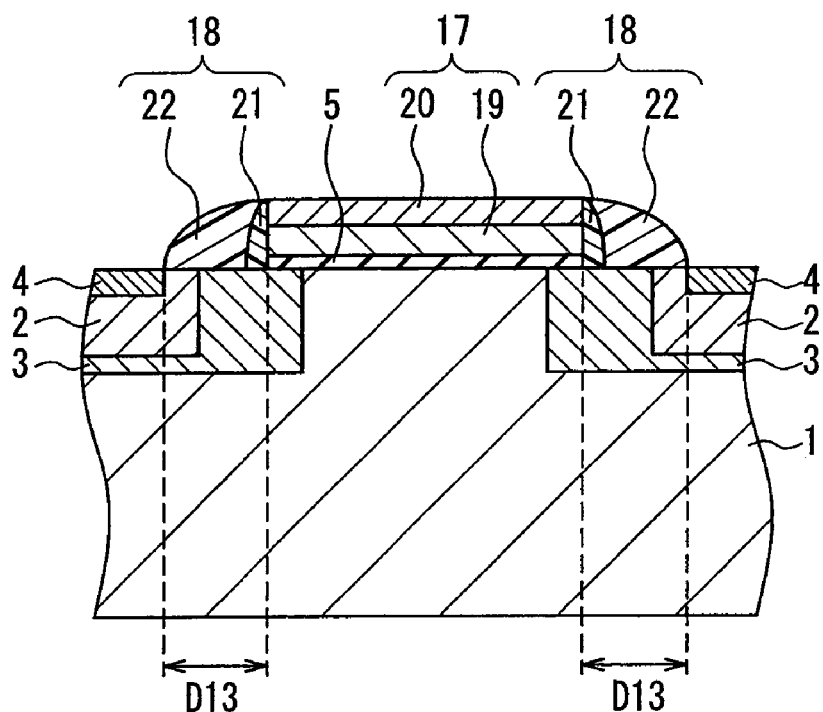
FIG. 8 is a cross-sectional view schematically showing a first transistor in Embodiment 3.

A solid-state imaging device according to Embodiment 3 will be described with reference to FIG. 8 showing a cross section of a first transistor. The solid-state imaging device in Embodiment 3 is the same as that according to Embodiment 1 except for a configuration of the first transistor. Thus, the same components as those in Embodiment 1 are denoted with the same reference numerals, and repeated descriptions thereof will be omitted. Only different portions will be described in detail. A second transistor is the same as that shown in FIG. 2.

The first transistor in the present embodiment is controlled by a sidewall spacer 18 having a width larger than that in the second transistor so that an edge interval D13 between a gate electrode 17 and a metal silicide layer 4 is larger than an edge interval between a gate electrode and a metal silicide layer in the second transistor.

The configuration of this first transistor is different from that in each of the above embodiments in the gate electrode 17 and the sidewall spacer 18.

The gate electrode 17 is formed of a polysilicon film 19 and a metal silicide film 20. The sidewall spacer 18 has a two-layer structure formed of a first layer spacer 21 and a second layer spacer 22. An edge of the metal silicide layer 4 formed on a surface of an n$^+$ diffusion layer 2 is controlled by the second layer spacer 22, and the edge interval D13 between the gate electrode 17 and the metal silicide layer 4 is substantially the same as the width of the sidewall spacer 18. The edge interval D13 in the first transistor is larger than the edge interval D2 in the second transistor.

Next, a description will be given of an exemplary method for forming the first transistor shown in FIG. 8 and the second transistor shown in FIG. 2 on the same semiconductor substrate together.

Initially, on a p-type semiconductor substrate 1, a gate insulating film 5 and polysilicon films 10 and 19 for constituting the gate electrodes 9 and 17, respectively, are formed, and LDD regions 3 are formed. The process so far is the same as that in Embodiment 1.

After the formation of the LDD regions 3, a thin insulating film (e.g., film thickness: 6 to 10 nm) is deposited on an entire surface of the semiconductor substrate 1, and the deposited insulating film is subjected to etch back by anisotropic etching. As a result, sidewalls constituting the first layer spacers 21 are formed on end surfaces of the gate electrode 17 of the first transistor. At the same time, sidewalls of the same kind also are formed on end surfaces of the gate electrode 9 of the second transistor. Then, a region where the first transistor is formed is masked, and the sidewalls formed on the end surfaces of the gate electrode 9 of the second transistor are removed by isotropic etching.

Then, again, an insulating film (e.g., film thickness: 60 to 100 nm) is deposited on the entire surface of the semiconductor substrate 1, and the deposited insulating film is subjected to etch back by anisotropic etching. As a result, sidewalls constituting the second layer spacers 22 are formed in outer edge portions of the first layer spacers 21 of the first transistor. Further, sidewall spacers 7 are formed on end surfaces of the gate electrode 9 of the second transistor.

After the formation of the sidewall spacers 7 and 18, the n$^+$ diffusion layers 2 are formed in the same manner as in Embodiment 1. After the n$^+$ diffusion layers 2 are formed, the metal silicide layers 4 and 12 on the n$^+$ diffusion layers 2 and the metal silicide layers 11 and 20 of the gate electrodes 9 and 17, respectively, are formed without forming an insulating film. By the above process, the first transistor and the second transistor can be formed together.

According to the first transistor of the present embodiment, an image signal that holds picked-up information with high accuracy is generated, and a defective display in an image display device inside or outside the solid-state imaging device is suppressed as in the solid-state imaging device according to each of Embodiments 1 and 2.

Although in the above description, the sidewall spacer 18 of the first transistor has a two-layer structure, it may have a structure of three layers or more.

EMBODIMENT 4

Figure 9:
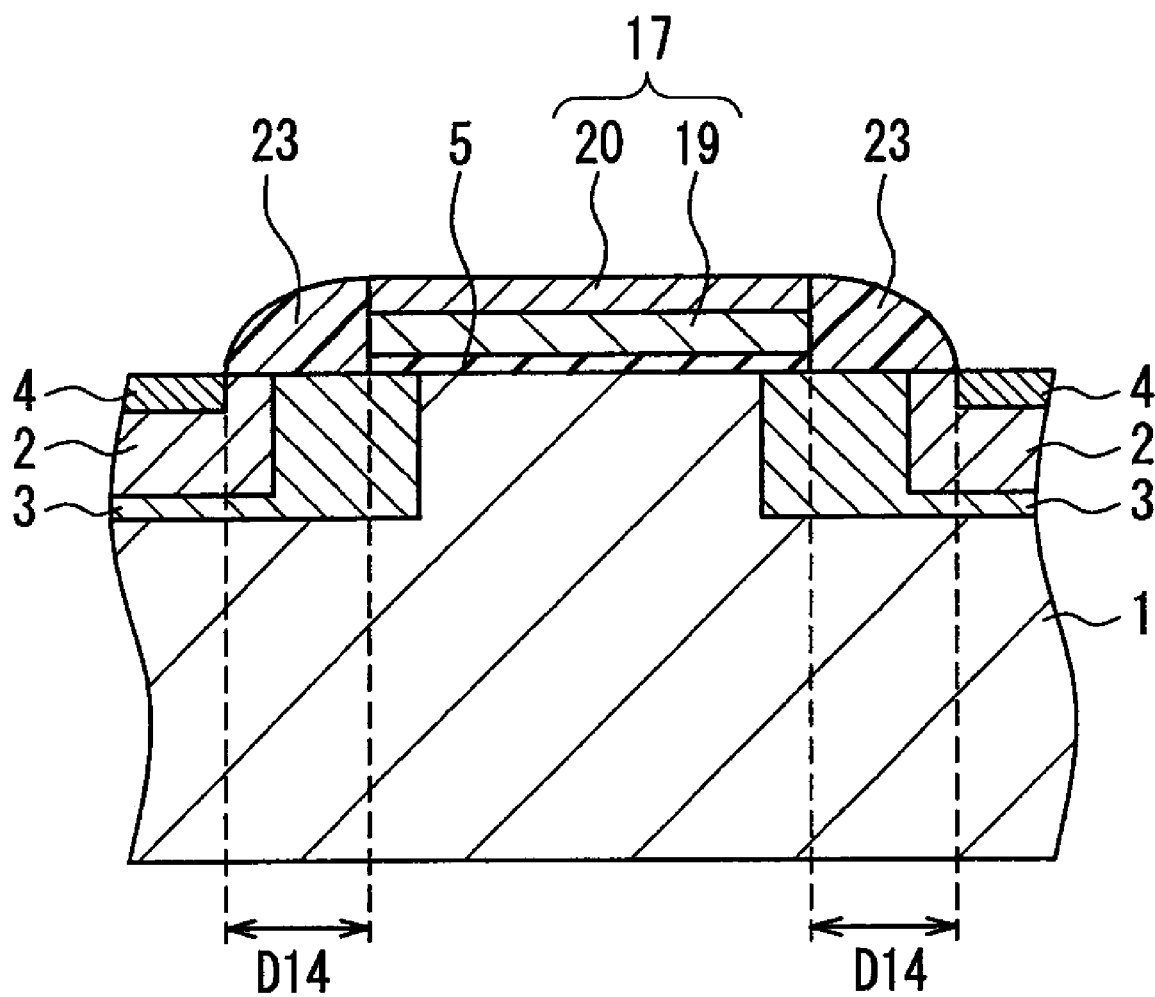
FIG. 9 is a cross-sectional view schematically showing a first transistor in Embodiment 4.

A solid-state imaging device according to Embodiment 4 will be described with reference to FIG. 9 showing a cross section of a first transistor. The solid-state imaging device in Embodiment 4 is the same as that according to Embodiment 1 except for a configuration of the first transistor. Further, the configuration of the first transistor is obtained by modifying a part of the configuration of the first transistor in Embodiment 3. Thus, the same components as those in Embodiment 3 are denoted with the same reference numerals, and only different portions will be described in detail. A second transistor is the same as that shown in FIG. 2.

The above-described first transistor in Embodiment 3 has the sidewall spacers 18 having a two-layer structure. On the other hand, the first transistor of the present embodiment has sidewall spacers 23 having a one-layer structure. The sidewall spacer 23 having a one-layer structure has a width larger than that of a sidewall spacer 7 of the second transistor, so that an edge interval D14 between a gate electrode 17 and a metal silicide layer 4 on an n$^+$ diffusion layer 2 is controlled.

The configuration of this first transistor is the same as that of the first transistor in Embodiment 3 except for the sidewall spacer 23.

An end of the metal silicide layer 4 on a gate electrode 17 side is controlled by the sidewall spacer 23, and the edge interval D14 has substantially the same width as that of the sidewall spacer 23. The width of the sidewall spacer 23 is set so that the edge interval D14 is larger than the edge interval D2 in the second transistor shown in FIG. 2.

Next, a description will be given of two exemplary manufacturing methods for forming the first transistor shown in FIG. 9 and the second transistor shown in FIG. 2 on the same semiconductor substrate together.

The first manufacturing method is as follows. Initially, a gate insulating film 5 of the first and the second transistors and polysilicon films 19 and 10 for constituting the gate electrodes 17 and 9, respectively, are formed collectively. After the polysilicon films 19 and 10 are formed, LDD regions are formed. The process so far is the same as that in Embodiment 3.

After the formation of the LDD regions 3, an insulating film is deposited on an entire surface of the semiconductor substrate 1. Then, the deposited insulating film is subjected to etch back by anisotropic etching. As a result, the sidewall spacers 23 are formed on end surfaces of the gate electrode 17 of the first transistor. Further, sidewalls also are formed at outer edges of a gate electrode 9 of the second transistor. Then, a region where the first transistor is formed is masked, and the sidewalls formed on the end surfaces of the gate electrode 9 of the second transistor are subjected to etching such as wet etching, thereby reducing their widths. As a result, the sidewall spacers 7 shown in FIG. 2 are formed.

After the formation of the sidewall spacers 7 of the second transistor, the n$^+$ diffusion layers 4 are formed, and the metal silicide layers 4 and 12 are formed in the same manner as in Embodiment 3. By the above process, the first transistor and the second transistor can be formed together.

Next, the second manufacturing method will be described. The same process as that in the first manufacturing method is taken until the LDD regions 3 are formed, and then first sidewalls are formed on the end surfaces of the gate electrode 17 of the first transistor. Further, second sidewalls are formed on the end surfaces of the gate electrode 9 of the second transistor, the second sidewalls being made of a material having a higher etching rate with respect to a predetermined cleaning liquid (material that is more likely to be etched) than a material of the first sidewalls.

In general, in a manufacturing process of a solid-state imaging device, at least one cleaning process is performed while the sidewalls of the first transistor and the sidewalls of the second transistor are exposed. Examples of such a cleaning process include cleaning to be performed after the injection of a high concentration of impurity for forming the n$^+$ diffusion layer 2 and cleaning for removing a natural oxide film (not shown) on a silicon surface of the semiconductor substrate 1. By performing at least one of such cleaning processes, the second sidewalls become narrower than the first sidewalls due to their larger etching amount. As a result, the first sidewalls form the sidewall spacers 23 in the first transistor, and the second sidewalls form the sidewall spacers 7 in the second transistor.

A cleaning liquid generally used in the cleaning process is a hydrogen peroxide and ammonia mixture or buffered hydrofluoric acid. The etching rates of a silicon nitride film and a silicon oxide film with respect to a hydrogen peroxide and ammonia mixture at about 70° C. are 0.5 nm/min and 3.8 nm/min, respectively. Further, the etching rates of a silicon nitride film and a silicon oxide film with respect to buffered hydrofluoric acid at room temperature are 0.5 nm/min and 101 nm/min, respectively. Accordingly, the sidewall spacer 23 of the first transistor should be formed of a silicon nitride film, and the sidewall spacer 7 of the second transistor should be formed of a silicon oxide film.

According to the first transistor of the present embodiment, the edge interval D14 in the first transistor can be made larger than the edge interval D2 in the second transistor. Therefore, an image signal that holds picked-up image information with high accuracy is generated, and a defective display in an image display device inside or outside the solid-state imaging device is suppressed as in the solid-state imaging device according to Embodiment 1.

Although Embodiments 1 to 4 have been described with respect to the case where the first transistor is an n-channel type transistor, a p-channel type transistor also can be applied to the concept of the embodiments similarly. Although polysilicon is used as a material for forming the gate electrode, other conductive materials are also available. Although the metal silicide layer 4 is provided on the surface portions of both the n$^+$ diffusion layers 2, no metal silicide layer may be provided on a surface portion of one of the n$^+$ diffusion layers 2.

Further, the configuration of the first transistor may be applied to whole transistors included in the noise suppressing circuit 7, or to transistors included in circuits other than the noise suppressing circuit.

INDUSTRIAL APPLICABILITY

The solid-state imaging device according to the present invention converts pixel signals generated by photosensitive cells into image signals with increased accuracy, thereby improving image quality, and is useful for a camera and the like.

The invention claimed is:

1. A solid-state imaging device, comprising:
 a plurality of photosensitive cells, each having a photodiode, arranged on a semiconductor substrate in a matrix; and
 a peripheral driving circuit that has a plurality of transistors formed on the semiconductor substrate and is configured to drive the plurality of photosensitive cells, the plurality of transistors including a first transistor and a second transistor, the first transistor having a first diffusion layer as a source or a drain where a signal potential corresponding to a signal charge generated by the photodiode is transmitted and held, and the second transistor having a second diffusion layer as a source and a drain where the signal potential is not transmitted,
 wherein a first edge interval as a distance between an edge of a metal silicide layer formed on a surface of the first diffusion layer and an edge of a gate electrode in the first transistor is larger than a second edge interval as a distance between an edge of a metal silicide layer formed on a surface of the second diffusion layer and an edge of a gate electrode in the second transistor.

2. The solid-state imaging device according to claim 1, wherein an edge interval between a metal silicide layer formed on a surface of a paired diffusion layer that pairs up with the first diffusion layer to constitute the source or the drain and the gate electrode in the first transistor is substantially the same as the first edge interval.

3. The solid-state imaging device according to claim 1, wherein an edge interval between a metal silicide layer formed on a surface of a paired diffusion layer that pairs up with the first diffusion layer to constitute the source or the drain and the gate electrode in the first transistor is smaller than the first edge interval.

4. The solid-state imaging device according to claim 1, wherein an edge interval between a metal silicide layer formed on a surface of a paired diffusion layer that pairs up with the first diffusion layer to constitute the source or the drain and the gate electrode in the first transistor is substantially the same as the second edge interval in the second transistor.

5. The solid-state imaging device according to claim 1,
 wherein the peripheral driving circuit has a vertical driver circuit connected to the plurality of photosensitive cells for sequentially extracting a plurality of pixel signals in accordance with the signal charge in units of horizontal rows, a noise suppressing circuit for removing noise from the plurality of pixel signals extracted by the vertical driver circuit, and a horizontal driver circuit for sequentially outputting the plurality of pixel signals from the noise suppressing circuit in temporal order, and
 the first transistor is included in the noise suppressing circuit.

6. The solid-state imaging device according to claim 1, wherein the first edge interval is 60 nm or more.

7. The solid-state imaging device according to claim 1,
 wherein the first transistor has an insulating film provided so as to range from the gate electrode to a part of the first diffusion layer, and the insulating film forms a first covering portion covering an end of the first diffusion layer, and
 a distance from an edge of the gate electrode on a first diffusion layer side to an edge of the first covering portion on a side farther from the gate electrode is substantially the same as the first edge interval.

8. The solid-state imaging device according to claim 7,
 wherein an edge interval between a metal silicide layer formed on a surface of a paired diffusion layer that pairs up with the first diffusion layer to constitute the source or the drain and the gate electrode in the first transistor is substantially not more than the first edge interval, the insulating film is provided so as to range from the gate electrode to a part of the paired diffusion layer, and forms a second covering portion covering a part of its surface, and a distance from an edge of the gate electrode on the paired diffusion layer side to an edge of the second covering portion on a side farther from the gate electrode is substantially the same as an edge interval between the gate electrode and the metal silicide layer on the paired diffusion layer.

9. The solid-state imaging device according to claim 1, wherein the first transistor has a first sidewall spacer formed on an end surface of the gate electrode on a first diffusion layer side, and an insulating film provided so as to range from the gate electrode through the first sidewall spacer to a part of the first diffusion layer, the insulating film forms a first covering portion covering an end of the first diffusion layer, and a distance from an edge of the gate electrode on the first diffusion layer side to an edge of the first covering portion on a side farther from the gate electrode is substantially the same as the first edge interval, and the second transistor has a second sidewall spacer formed on an end surface of the gate electrode on a second diffusion layer side, and the second sidewall spacer has a width substantially the same as the second edge interval.

10. The solid-state imaging device according to claim 9, wherein an edge interval between a metal silicide layer formed on a surface of a paired diffusion layer that pairs up with the first diffusion layer to constitute the source or the drain and the gate electrode in the first transistor is substantially not more than the first edge interval, the first sidewall spacer also is formed on an end surface of the gate electrode on the paired diffusion layer side in the first transistor, and the insulating film is provided so as to range from the gate electrode through the first sidewall spacer to a part of the paired diffusion layer, and forms a second covering portion covering a part of its surface, and a distance from an edge of the gate electrode on the paired diffusion layer side to an edge of the second covering portion on a side farther from the gate electrode is substantially the same as an edge interval between the gate electrode and the metal silicide layer on the paired diffusion layer.

11. The solid-state imaging device according to claim 9, wherein an edge interval between a metal silicide layer formed on a surface of a paired diffusion layer that pairs up with the first diffusion layer to constitute the source or the drain and the gate electrode in the first transistor is substantially smaller than the first edge interval, and the first sidewall spacer also is formed on an end surface of the gate electrode on the paired diffusion layer side in the first transistor, and the first sidewall spacer has a width substantially the same as an edge interval between the gate electrode and the metal silicide layer on the paired diffusion layer.

12. The solid-state imaging device according to claim 7, wherein the insulating film is a silicide blocking film.

13. The solid-state imaging device according to claim 1, wherein the first transistor has a first sidewall spacer formed on an end surface of the gate electrode on a first diffusion layer side, and the first sidewall spacer has a width substantially the same as the first edge interval, and the second transistor has a second sidewall spacer formed on an end surface of the gate electrode on a second diffusion layer side, and the second sidewall spacer has a width substantially the same as the second edge interval.

14. The solid-state imaging device according to claim 13, wherein an edge interval between a metal silicide layer formed on a surface of a paired diffusion layer that pairs up with the first diffusion layer to constitute the source or the drain and the gate electrode in the first transistor is substantially not more than the first edge interval, and the first sidewall spacer also is formed on an end surface of the gate electrode on the paired diffusion layer side in the first transistor, and the first sidewall spacer has a width substantially the same as an edge interval between the gate electrode and the metal silicide layer on the paired diffusion layer.

15. The solid-state imaging device according to claim 13, wherein the sidewall spacer in the first transistor is made of a material different from that of the sidewall spacer in the second transistor.

16. The solid-state imaging device according to claim 13, wherein the sidewall spacer in the first transistor is formed of a silicon nitride film, and the sidewall spacer in the second transistor is formed of a silicon oxide film.

17. The solid-state imaging device according to claim 9, wherein the insulating film is a silicide blocking film.

* * * * *